United States Patent
Chang et al.

(10) Patent No.: US 10,559,557 B2
(45) Date of Patent: Feb. 11, 2020

(54) MICRO LED DISPLAY PANEL AND METHOD FOR MAKING SAME

(71) Applicant: HON HAI PRECISION INDUSTRY CO., LTD., New Taipei (TW)

(72) Inventors: Wei-Chih Chang, New Taipei (TW); Chung-Wen Lai, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 0 days.

(21) Appl. No.: 16/016,750

(22) Filed: Jun. 25, 2018

(65) Prior Publication Data

US 2019/0013305 A1    Jan. 10, 2019

Related U.S. Application Data

(60) Provisional application No. 62/529,548, filed on Jul. 7, 2017.

(51) Int. Cl.

| | |
|---|---|
| *H01L 25/16* | (2006.01) |
| *H01L 25/075* | (2006.01) |
| *H01L 27/146* | (2006.01) |
| *H01L 27/15* | (2006.01) |
| *H01L 27/32* | (2006.01) |
| *H01L 33/42* | (2010.01) |
| *H01L 33/62* | (2010.01) |
| *H01L 33/00* | (2010.01) |
| *H01L 33/30* | (2010.01) |
| *H01L 27/12* | (2006.01) |
| *H01L 33/32* | (2010.01) |

(52) U.S. Cl.
CPC ........ *H01L 25/167* (2013.01); *H01L 25/0753* (2013.01); *H01L 25/0756* (2013.01); *H01L 27/14645* (2013.01); *H01L 27/14647* (2013.01); *H01L 27/14667* (2013.01); *H01L 27/153* (2013.01); *H01L 27/3209* (2013.01); *H01L 33/0062* (2013.01); *H01L 33/0075* (2013.01); *H01L 33/42* (2013.01); *H01L 33/62* (2013.01); *H01L 27/1222* (2013.01); *H01L 33/305* (2013.01); *H01L 33/325* (2013.01)

(58) Field of Classification Search
CPC ............... H01L 27/3209; H01L 27/153; H01L 27/3225; H01L 27/3206; H01L 27/3211; H01L 27/3216; H01L 27/14643; H01L 27/14645; H01L 25/0657; H01L 25/0753; H01L 25/0756; H01L 25/167; H01L 33/0062; H01L 33/0075; H01L 33/42; H01L 332/62; H01L 33/305; H01L 33/325

See application file for complete search history.

(56) References Cited

U.S. PATENT DOCUMENTS

2016/0163940 A1* 6/2016 Huang .................... H01L 33/62
257/89

* cited by examiner

*Primary Examiner* — Thanhha S Pham
(74) *Attorney, Agent, or Firm* — ScienBiziP, P.C.

(57) ABSTRACT

A micro LED display panel includes a blue LED layer, a green LED layer, and a red LED layer. The blue LED layer, the green LED layer, and the red LED layer are in a stacked formation. The blue, the green, and the red LED layers each include a plurality of micro LEDs spaced apart from each other. The composition of the layers is such that light emitted from all but the bottom layer is able to pass through transparent material in other layers before exiting the panel and being viewed.

7 Claims, 2 Drawing Sheets

MICRO LED DISPLAY PANEL AND METHOD FOR MAKING SAME

FIELD

The subject matter herein generally relates to a micro LED display panel and a method for making the micro LED display panel.

BACKGROUND

A conventional micro LED display panel generally includes a plurality of pixel units. Each pixel unit generally includes a red sub-pixel, a green sub-pixel, and a blue sub-pixel. However, the red sub-pixel, the green sub-pixel, and the blue sub-pixel are usually arranged horizontally, and since each sub-pixel is tiny (e. g. less than 100 μm), the processing precision of the micro LED display panel is required to be very high, which limits manufacturing yield. Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
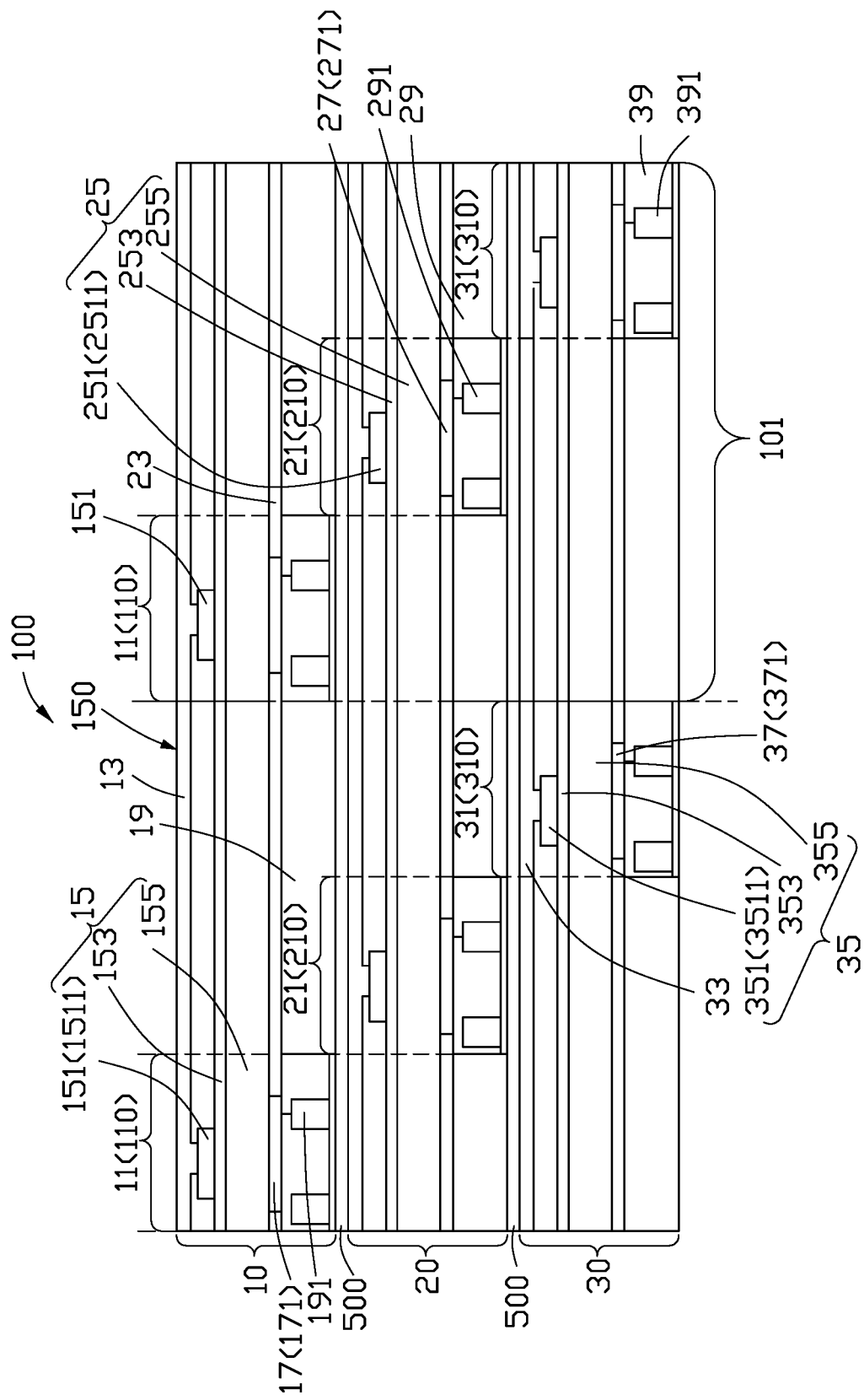
FIG. 1 is a cross-sectional view of a first embodiment of a micro LED display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically forms open-ended inclusion or membership in the so-described combination, group, series, and the like.

The term "micro LED" in this disclosure refers to an LED having a size of a few millimeters or less (e. g. several millimeters, several hundred micrometers, or less than 100 micrometers).

First Embodiment

FIG. 1 illustrates a micro LED display panel 100 according to a first embodiment. The micro LED display panel 100 includes a stack of a blue LED layer 10, a green LED layer 20, and a red LED layer 30. In this embodiment, the green LED layer 20 is between the blue LED layer 10 and the red LED layer 30. The blue LED layer 10 includes a plurality of blue micro LEDs 11 spaced apart from each other; each blue micro LED 11 defines a blue sub-pixel 110. The green LED layer 20 includes a plurality of green micro LEDs 21 spaced apart from each other; each green micro LED 21 defines a green sub-pixel 210. The red LED layer 30 includes a plurality of red micro LEDs 31 spaced apart from each other; each red micro LED 31 defines a red sub-pixel 310. The blue sub-pixels 110, the green sub-pixels 210, and the red sub-pixels 310 do not overlap with each other. A projection of each blue sub-pixel 110, a projection of each green sub-pixel 210, and a projection of each red sub-pixel 310 along the depth direction of the micro LED display panel 100 does not overlap with each other. One green sub-pixel 210 and its adjacent red sub-pixel 310 are between two adjacent blue sub-pixels 110.

In this embodiment, a region of the green LED layer 20 between any two adjacent green sub-pixels 210 is transparent, so that light emitted from the red LED layer 30 below the green LED layer 20 can pass through the green LED layer 20. A region of the blue LED layer 10 between any two adjacent blue sub-pixels 110 is transparent, so that light emitted from the red LED layer 30 and the green LED layer 20 below the blue LED layer 10 can pass through the blue LED layer 10.

As shown in FIG. 1, the blue LED layer 10 includes a stack of a first transparent conductive layer 13, a first light emitting layer 15, and a first electrode layer 17. The first light emitting layer 15 is between the first transparent conductive layer 13 and the first electrode layer 17. The first transparent conductive layer 13 and the first electrode layer 17 serve as cathode and anode respectively of the first light emitting layer 15. When there is a potential difference between the first transparent conductive layer 13 and the first electrode layer 17, the first light emitting layer 15 emits blue light. The first light emitting layer 15 includes a stack of a P-type doped inorganic light emitting layer 151, an active layer 153, and an N-type doped inorganic light emitting layer 155. The active layer 153 is between the P-type doped inorganic light emitting layer 151 and the N-type doped inorganic light emitting layer 155. The P-type doped inorganic light emitting layer 151 is close to and coupled to the first transparent conductive layer 13; and the N-type doped inorganic light emitting layer 155 is close to and coupled to the first electrode layer 17.

As shown in FIG. 1, the blue LED layer 10 further includes a first substrate 19 configured for carrying the first transparent conductive layer 13, the first light emitting layer 15, and the first electrode layer 17. The first electrode layer 17 is formed on the first substrate 19, the first light emitting layer 15 is formed on the first electrode layer 17, and the first transparent conductive layer 13 is formed on the first light emitting layer 15. At least a portion of the first substrate 19 is transparent, so that light emitted from the red LED layer 30 and the green LED layer 20 below the blue LED layer 10 can pass through the first substrate 19.

As shown in FIG. 1, the first substrate 19 includes a substrate (not shown) and a plurality of thin film transistors (TFTs) 191 on the substrate. The first electrode layer 17 is electrically coupled to the TFTs 191. The TFTs 191 provides driving voltages to the first electrode layer 17. The TFT 191 may be a low-temperature polysilicon TFT, an a-Si type TFT, or a metal oxide TFT. In this embodiment, the TFT 191 is a low-temperature polysilicon TFT.

As shown in FIG. 1, the first transparent conductive layer 13, the active layer 153, and the N-type doped inorganic light emitting layer 155 are continuous in covering the first substrate 19. The P-type doped inorganic light emitting layer 151 is discontinuous and includes a plurality of P-type doped units 1511 spaced apart from each other. The first electrode layer 17 is discontinuous and includes a plurality of electrodes 171 spaced apart from each other. Each P-type doped unit 1511 is directly coupled to and contacts the first transparent conductive layer 13. Each electrode 171 is electrically coupled to one TFT on the first substrate 19. Each P-type doped unit 1511 corresponds to one electrode 171, and a projection of each P-type doped unit 1511 on the first electrode layer 17 at least partially overlaps with one electrode 171. In the blue LED layer 10, each P-type doped unit 1511 and one corresponding electrode 171, and a portion of the active layer 153 and a portion of the N-type doped inorganic light emitting layer 155 between the P-type doped unit 1511 and the electrode 171 cooperatively define a light emitting region of the blue LED layer 10. Each light emitting region of the blue LED layer 10 forms a blue micro LED 11 (substantially a blue sub-pixel 110). Other regions of the blue LED layer 10 apart from the light emitting regions (the blue sub-pixels 110) are transparent, so that light emitted from the red LED layer 30 and the green LED layer 20 below the blue LED layer 10 can pass through the other regions of the blue LED layer 10.

As shown in FIG. 1, the green LED layer 20 includes a stack of a second transparent conductive layer 23, a second light emitting layer 25, and a second electrode layer 27. The second light emitting layer 25 is between the second transparent conductive layer 23 and the second electrode layer 27. The second transparent conductive layer 23 and the second electrode layer 27 serves as cathode and anode respectively of the second light emitting layer 25. When there is a potential difference between the second transparent conductive layer 23 and the second electrode layer 27, the second light emitting layer 25 will emit green light. The second light emitting layer 25 includes a stack of a P-type doped inorganic light emitting layer 251, an active layer 253, and an N-type doped inorganic light emitting layer 255. The active layer 253 is between the P-type doped inorganic light emitting layer 251 and the N-type doped inorganic light emitting layer 255. The P-type doped inorganic light emitting layer 251 is relatively close to and coupled to the second transparent conductive layer 23, the N-type doped inorganic light emitting layer 255 is relatively close to and coupled to the second electrode layer 27.

As shown in FIG. 1, the green LED layer 20 further includes a second substrate 29 configured for carrying the second transparent conductive layer 23, the second light emitting layer 25, and the second electrode layer 27. The second electrode layer 27 is formed on the second substrate 29, the second light emitting layer 25 is formed on the second electrode layer 27, and the second transparent conductive layer 23 is formed on the second light emitting layer 25. At least a portion of the second substrate 29 is transparent, so light emitted from the red LED layer 30 below the green LED layer 20 can pass through the second substrate 29.

As shown in FIG. 1, the second substrate 29 includes a substrate (not shown) and a plurality of TFTs 291 on the substrate. The second electrode layer 27 is electrically coupled to the TFTs 291. The TFTs 291 provide driving voltages to the second electrode layer 27. The TFT 291 may be a low-temperature polysilicon TFT, an a-Si type TFT, or a metal oxide TFT. In this embodiment, the TFT 291 is a low-temperature polysilicon TFT.

As shown in FIG. 1, the second transparent conductive layer 23, the active layer 253, and the N-type doped inorganic light emitting layer 255 are continuous. The P-type doped inorganic light emitting layer 251 is discontinuous and includes a plurality of P-type doped units 2511 spaced apart from each other. The second electrode layer 27 is discontinuous and includes a plurality of electrodes 271 spaced apart from each other. Each P-type doped unit 2511 is directly coupled to and contacts the second transparent conductive layer 23. Each electrode 271 is electrically coupled to one TFT on the second substrate 29. Each P-type doped unit 2511 corresponds to one electrode 271, and a projection of each P-type doped unit 2511 on the second electrode layer 27 at least partially overlaps with one electrode 271. In the green LED layer 20, each P-type doped unit 2511 and its electrode 271, and a portion of the active layer 253 and a portion of the N-type doped inorganic light emitting layer 255 between the P-type doped unit 2511 and the electrode 271 cooperatively define a light emitting region of the green LED layer 20. Each light emitting region of the green LED layer 20 forms a green micro LED 21 (namely a green sub-pixel 210). Other regions of the green LED layer 20 apart from light emitting regions (green sub-pixels 210) are transparent, so that light emitted from the red LED layer 30 below the green LED layer 20 can pass through the other regions of the green LED layer 20.

As shown in FIG. 1, the red LED layer 30 includes a stack of a third transparent conductive layer 33, a third light emitting layer 35, and a third electrode layer 37. The third light emitting layer 35 is between the third transparent conductive layer 33 and the third electrode layer 37. The third transparent conductive layer 33 and the third electrode layer 37 serve as cathode and anode respectively of the third light emitting layer 35. When there is a potential difference between the third transparent conductive layer 33 and the third electrode layer 37, the third light emitting layer 35 emits red light. The third light emitting layer 35 includes a P-type doped inorganic light emitting layer 351, an active layer 353, and an N-type doped inorganic light emitting layer 355 as a stack. The active layer 353 is between the P-type doped inorganic light emitting layer 351 and the N-type doped inorganic light emitting layer 355. The P-type doped inorganic light emitting layer 351 is close to the third transparent conductive layer 33, the N-type doped inorganic light emitting layer 355 is close to the third electrode layer 37.

As shown in FIG. 1, the red LED layer 30 further includes a third substrate 39 configured for carrying the third transparent conductive layer 33, the third light emitting layer 35, and the third electrode layer 37. The third electrode layer 37 is formed on the third substrate 39, the third light emitting layer 35 is formed on the third electrode layer 37, and the third transparent conductive layer 33 is formed on the third light emitting layer 35. At least a portion of the third substrate 39 is transparent, so light emitted from the red LED layer 30 below the red LED layer 30 can pass through the third substrate 39.

As shown in FIG. 1, the third substrate 39 includes a substrate (not shown) and a plurality of TFTs 391 on the substrate. The third electrode layer 37 is electrically coupled to the TFTs 391. The TFTs 391 provide driving voltages to the third electrode layer 37. The TFT 391 may be a low-temperature polysilicon TFT, an a-Si type TFT, or a metal oxide TFT. In this embodiment, the TFT 391 is a low-temperature polysilicon TFT.

As shown in FIG. 1, the third transparent conductive layer 33, the active layer 353, and the N-type doped inorganic light emitting layer 355 are continuous. The P-type doped inorganic light emitting layer 351 is discontinuous and includes a plurality of P-type doped units 3511 spaced apart from each other. The third electrode layer 37 is discontinuous and includes a plurality of electrodes 371 spaced apart from each other. Each P-type doped unit 3511 is directly coupled to and contacts the third transparent conductive layer 33. Each electrode 371 is electrically coupled to one TFT 391 on the third substrate 39. Each P-type doped unit 3511 corresponds to one electrode 371, and a projection of each P-type doped unit 3511 on the third electrode layer 37 at least partially overlaps with one electrode 371. In the red LED layer 30, each P-type doped unit 3511 and its electrode 371, and a portion of the active layer 353 and a portion of the N-type doped inorganic light emitting layer 355 between the P-type doped unit 3511 and the electrode 371 cooperatively define a light emitting region of the red LED layer 30. Each light emitting region of the red LED layer 30 forms a red micro LED 31 (namely a red sub-pixel 310). As the red LED layer 30 is the lowermost LED layer, no portion of the red LED layer 30 is required to be transparent.

As shown in FIG. 1, the projections of each P-type doped unit 1511 on the third substrate 39, the projections of each P-type doped unit 2511 on the third substrate 39, and the projections of each P-type doped unit 3511 on the third substrate 39 do not overlap with each other. For example, the portion of the blue LED layer 10 apart from the P-type doped units 1511 (namely blue sub-pixels 110) is transparent, so that light emitted from the green LED layer 20 and the red LED 30 below the blue LED layer 10 can pass through blue LED layer 10. For example, the portion of the green LED layer 20 except for the P-type doped units 2511 (green sub-pixels 210) is transparent, so that light emitted from the red LED layer 30 below the green LED layer 20 can pass through the green LED layer 20. The micro LED panel 100 defines a plurality of pixels 101, although only two pixels 101 are shown in FIG. 1. Each pixel 101 includes one blue sub-pixel 110, one green sub-pixel 210, and one red sub-pixel 310, forming a stack through the different layers and staggered from each other.

It can be understood that, as the first electrode layer 17 on the first substrate 19 is discontinuous, a transparent insulating material may be formed on the first substrate 19. The transparent insulating material may be formed between every two adjacent electrodes 171 to electrically insulate the electrodes 171 from each other. As the P-type doped inorganic light emitting layer 151 on the active layer 153 is discontinuous, at least a transparent insulating material may also be formed on the active layer 153 and between every two adjacent P-type doped units 1511.

It can be understood that a transparent insulating binder (not shown) may also be between two adjacent LED layers (e.g. the blue LED layer 10 and the green LED layer 20 and the green LED layer 20 and the red LED layer 30) to integrally bond the two adjacent LED layers together.

It can be understood that, as the second electrode layer 27 on the second substrate 29 is discontinuous, a transparent insulating material may be formed on the second substrate 29, and the transparent insulating material may be formed between every two adjacent electrodes 271 to electrically insulate the electrodes 271 from each other. As the P-type doped inorganic light emitting layer 251 on the active layer 253 is discontinuous, at least a transparent insulating material may also be formed on the active layer 253 and between every two adjacent P-type doped units 2511.

It can be understood that, as the third electrode layer 37 on the third substrate 39 is discontinuous, a transparent insulating material may be formed on the third substrate 29, and the transparent insulating material may be formed between every two adjacent electrodes 371 to electrically insulate the electrodes 371 from each other. As the P-type doped inorganic light emitting layer 351 on the active layer 353 is discontinuous, at least a transparent insulating material may also be formed on the active layer 353 and between every two adjacent P-type doped units 3511.

The layers which are continuous are the active layer 153, the active layer 253, the active layer 353, the N-type doped inorganic light emitting layer 155, the N-type doped inorganic light emitting layer 255, and the N-type doped inorganic light emitting layer 355, the first transparent conductive layer 13, the second transparent conductive layer 23, and the third transparent conductive layer 33.

Second Embodiment

Figure 2:
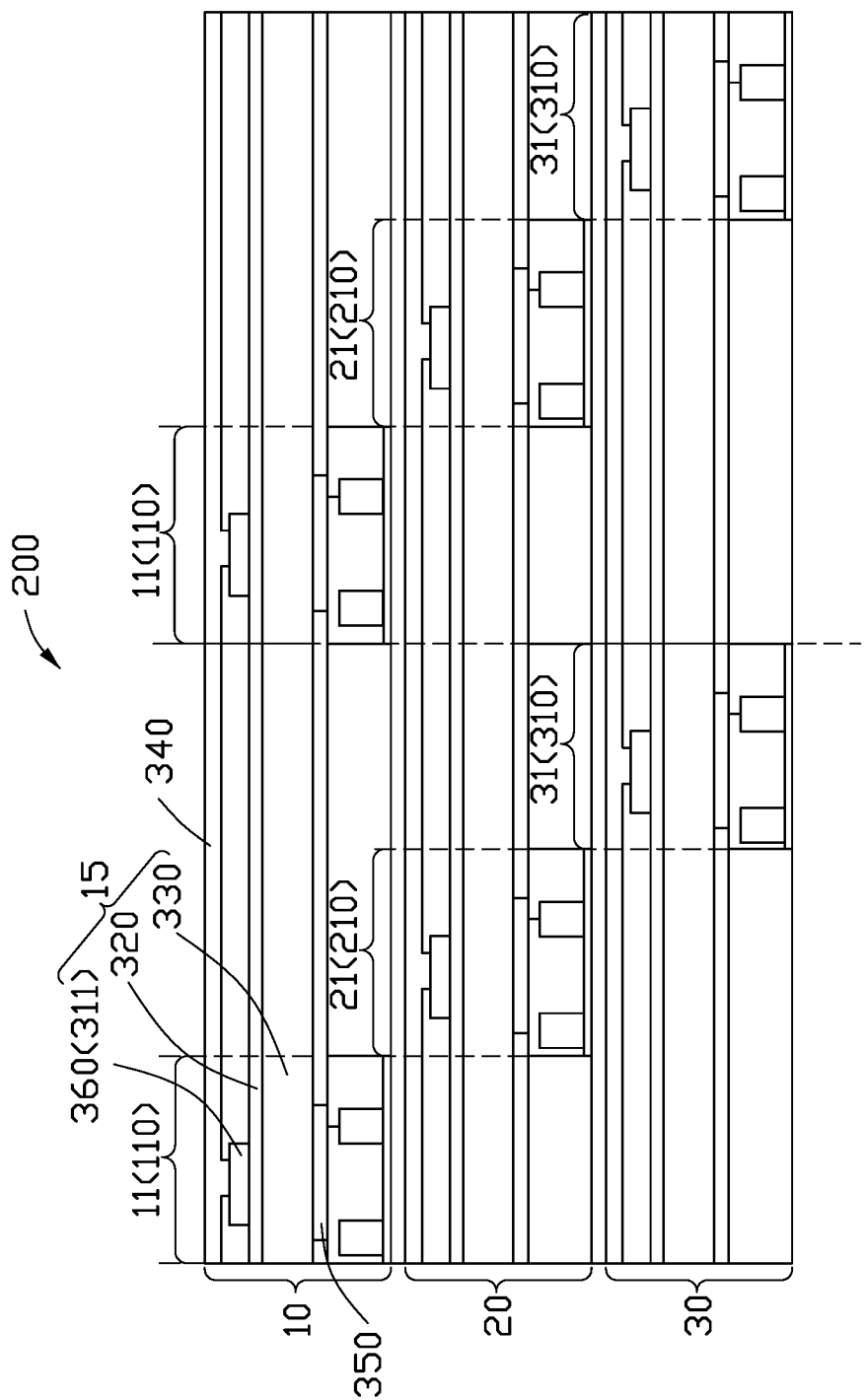
FIG. 2 is a cross-sectional view of a second embodiment of a micro LED display panel.

FIG. 2 illustrates a micro LED display panel 200 according to a second embodiment. The micro LED display panel 200 includes as a stack a blue LED layer 10, a green LED layer 20, and a red LED layer 30. In this embodiment, the green LED layer 20 is between the blue LED layer 10 and the red LED layer 30. The blue LED layer 10 forms a plurality of blue micro LEDs 11 spaced apart from each other and each blue micro LED 11 defines a blue sub-pixel 110. The green LED layer 20 forms a plurality of green micro LEDs 21 spaced apart from each other and each green micro LED 21 defines a green sub-pixel 210. The red LED layer 30 forms a plurality of red micro LEDs 31 spaced apart from each other and each red micro LED 31 defines a red sub-pixel 310. The blue sub-pixels 110, the green sub-pixels 210, and the red sub-pixels 310 do not overlap with each other and are staggered from each other. The projections of each blue sub-pixel 110, the projections of each green sub-pixel 210, and the projections of each red sub-pixel 310 along the depth direction of the micro LED display panel 100 do not overlap with and are staggered from each other. One green sub-pixel 210 and its adjacent red sub-pixel 310 are between two adjacent blue sub-pixels 110.

The micro LED display panel 200 is substantially the same as the micro LED display panel 100 of the first embodiment, but a light emitting layer 300 of the blue LED layer 10, a light emitting layer 300 of the green LED layer 20, and a light emitting layer 300 of the red LED layer 30 are different from those of the micro LED display panel 100. In this embodiment, the light emitting layer 300 for each of the blue LED layer 10, the green LED layer 20, and the red LED layer 30 includes as a stack an N-type doped inorganic light emitting layer 360, an active layer 320, and a P-type doped inorganic light emitting layer 330. The active layer 320 is between the P-type doped inorganic light emitting layer 330 and the N-type doped inorganic light emitting layer 360. The P-type doped inorganic light emitting layer 330 is close to and coupled to the electrode layer 350 and the N-type doped inorganic light emitting layer 360 is close to and coupled to the transparent conductive layer 340. The N-type doped inorganic light emitting layer 360 is discontinuous and includes a plurality of N-type doped units 311 spaced apart from each other and the P-type doped inorganic light emitting layer 330 is a continuous layer.

The stacking order of the N-type doped inorganic light emitting layer 360 and the P-type doped inorganic light emitting layer 330 in the light emitting layer 300 in this embodiment is different from the stacking order in the first embodiment, and the voltage applied to the cathode and the anode (the electrode layer 350 and the transparent conductive layer 340) of the corresponding light-emitting layer 300 is adjusted so that the light-emitting layer 300 can emit light.

The stacking order of the green LED layer 20, the blue LED layer 10, and the red LED layer 30 is not limited to that shown in the micro LED display panel 100 and the micro LED display panel 200 and may be changed. For example, the blue LED layer 10 is stacked above the red LED layer 30; and the green LED layer 20 is stacked above the blue LED layer 10. Regardless of the stacking order of the green LED layer 20, the blue LED layer 10, and the red LED layer 30, it is necessary to ensure transparency in the region between any two neighboring two same-color sub-pixels of each of the two LED layers relatively closer to a light-emitting surface 150 of the micro LED display panel, so light emitted from the two LED layers under the topmost LED layer can pass therethrough.

It can be understood that the first substrate 19, the second substrate 29, and the third substrate 39 may be made of various transparent plastics commonly used in the field, such as polyimide (PI), polyethylene terephthalate (PET), poly ethylene naphthalte (PEN). The thicknesses of the first substrate 19, the second substrate 29, and the third substrate 39 are all in a range of about 2 μm to about 100 μm.

It can be understood that the P-type doped inorganic light emitting layers of the first light emitting layer 15 and the second light emitting layer 25 may include GaN:Mg. The active layers of the first light emitting layer 15 and the second light emitting layer 25 may include InGaN. The N-type doped inorganic light emitting layers of the first light emitting layer 15 and the second light emitting layer 25 may include GaN:Si. The P-type doped inorganic light emitting layer of the third light emitting layer 35 may include AlInGaP. The active layer of the third light emitting layer 35 may include InGaAsP. The N-type doped inorganic light emitting layer of the third light emitting layer 35 may include AlInGaP.

A method for making the micro LED display panel 100 and 200 will be described. The method may include one or more of the following steps. The example method is provided by way of example, as there are a variety of ways to carry out the method. Depending on the embodiment, additional steps can be added, others removed, and the ordering of the steps can be changed.

A blue LED layer is formed. The blue LED layer includes a plurality of blue micro LEDs spaced apart from each other, each blue micro LED defines a blue sub-pixel.

A green LED layer is formed. The green LED layer includes a plurality of green micro LEDs spaced apart from each other, each green micro LED defines a green sub-pixel.

A red LED layer is formed. The red LED layer includes a plurality of red micro LEDs spaced apart from each other and each red micro LED defines a red sub-pixel.

The blue LED layer, the green LED layer, and the red LED layer are stacked on each other. Each blue sub-pixel, each green sub-pixel, and each red sub-pixel are staggered from each other.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A micro LED display panel, comprising:
a blue LED layer, the blue LED layer comprising a plurality of blue micro LEDs spaced apart from each other, each of the plurality of blue micro LEDs defining a blue sub-pixel;
a green LED layer, the green LED layer comprising a plurality of green micro LEDs spaced apart from each other, each of the plurality of green micro LEDs defining a green sub-pixel; and
a red LED layer, the red LED layer comprising a plurality of red micro LEDs spaced apart from each other, each of the plurality of red micro LEDs defining a red sub-pixel;
wherein the blue LED layer, the green LED layer, and the red LED layer are stacked one by one along a depth direction of the micro LED display panel; and
wherein each of the plurality of blue micro LEDs, each of the plurality of green micro LEDs, and each of the plurality of red micro LEDs are staggered from each other;
wherein the blue LED layer comprises a first transparent conductive layer, a first light emitting layer, and a first electrode layer stacked one by one along the depth direction; the first light emitting layer is between the first transparent conductive layer and the first electrode layer; the first light emitting layer comprises a P-type doped inorganic light emitting layer, an active layer, and an N-type doped inorganic light emitting layer stacked one by one along the depth direction; the active layer is between the P-type doped inorganic light emitting layer and the N-type doped inorganic light emitting layer; the P-type doped inorganic light emitting layer comprises a plurality of P-type doped units spaced apart from each other; the first electrode layer comprises a plurality of electrodes spaced apart from each other; each of the plurality of P-type doped units is coupled to the first transparent conductive layer; the N-type doped inorganic light emitting layer is coupled to each of the plurality of electrodes; a projection of each of the plurality of P-type doped units on the first electrode layer overlaps with one of the plurality of electrodes; a portion of the blue LED layer corresponding to one of the plurality of P-type doped units defines one blue sub-pixel.

2. The micro LED display panel of claim 1, wherein the micro LED display panel comprises a light emitting surface; each of the two of the blue LED layer, the green LED layer, and the red LED layer that adjacent to the light emitting surface comprises transparent regions between any two neighboring same-color sub-pixels.

3. The micro LED display panel of claim 1, wherein the blue LED layer further comprises a first substrate; the first transparent conductive layer, the first light emitting layer, and the first electrode layer are stacked on the first substrate; the first electrode layer is adjacent to the first substrate; the first substrate comprises a plurality of TFTs, each of the plurality of electrodes is electrically coupled to one of the plurality of TFTs.

4. The micro LED display panel of claim 1, wherein the green LED layer comprises a second transparent conductive layer, a second light emitting layer, and a second electrode layer stacked one by one along the depth direction; the second light emitting layer is between the second transparent conductive layer and the second electrode layer; the second light emitting layer comprises a P-type doped inorganic light emitting layer, an active layer, and an N-type doped inorganic light emitting layer stacked one by one along the depth direction; the active layer is between the P-type doped inorganic light emitting layer and the N-type doped inorganic light emitting layer; the P-type doped inorganic light emitting layer comprises a plurality of P-type doped units spaced apart from each other; the second electrode layer comprises a plurality of electrodes spaced apart from each other; each of the plurality of P-type doped units is coupled to the second transparent conductive layer; the N-type doped inorganic light emitting layer is coupled to each of the plurality of electrodes; a projection of each of the plurality of P-type doped units on the second electrode layer overlaps with one of the plurality of electrodes; a portion of the green LED layer corresponding to one of the plurality of P-type doped units defines one green sub-pixel.

5. The micro LED display panel of claim 4, wherein the green LED layer further comprises a second substrate; the second transparent conductive layer, the second light emitting layer, and the second electrode layer are stacked on the second substrate; the second electrode layer is adjacent to the second substrate; the second substrate comprises a plurality of TFTs, each of the plurality of electrodes is electrically coupled to one of the plurality of TFTs.

6. The micro LED display panel of claim 1, wherein the red LED layer comprises a third transparent conductive layer, a third light emitting layer, and a third electrode layer stacked one by one along the depth direction; the third light emitting layer is between the third transparent conductive layer and the third electrode layer; the third light emitting layer comprises a P-type doped inorganic light emitting layer, an active layer, and an N-type doped inorganic light emitting layer stacked one by one along the depth direction; the active layer is between the P-type doped inorganic light emitting layer and the N-type doped inorganic light emitting layer; the P-type doped inorganic light emitting layer comprises a plurality of P-type doped units spaced apart from each other; the third electrode layer comprises a plurality of electrodes spaced apart from each other; each of the plurality of P-type doped units is coupled to the third transparent conductive layer; the N-type doped inorganic light emitting layer is coupled to each of the plurality of electrodes; a projection of each of the plurality of P-type doped units on the third electrode layer overlaps with one of the plurality of electrodes; a portion of the red LED layer corresponding to one of the plurality of P-type doped units defines one red sub-pixel.

7. The micro LED display panel of claim 6, wherein the red LED layer further comprises a third substrate; the third transparent conductive layer, the third light emitting layer, and the third electrode layer are stacked on the third substrate; the third electrode layer is adjacent to the third substrate; the third substrate comprises a plurality of TFTs, each of the plurality of electrodes is electrically coupled to one of the plurality of TFTs.

* * * * *